United States Patent
Efland et al.

(10) Patent No.: US 7,045,903 B2
(45) Date of Patent: May 16, 2006

(54) INTEGRATED POWER CIRCUITS WITH DISTRIBUTED BONDING AND CURRENT FLOW

(75) Inventors: Taylor R. Efland, Richardson, TX (US); Sameer Pendharkar, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 315 days.

(21) Appl. No.: 09/917,419

(22) Filed: Jul. 30, 2001

(65) Prior Publication Data

US 2002/0011674 A1    Jan. 31, 2002

Related U.S. Application Data

(60) Provisional application No. 60/221,051, filed on Jul. 27, 2000.

(51) Int. Cl.
  *H01L 23/48* (2006.01)
  *H01L 23/52* (2006.01)
  *H01L 29/40* (2006.01)

(52) U.S. Cl. ...................... 257/784; 257/786
(58) Field of Classification Search ............ 257/784, 257/786, 780, 690
   See application file for complete search history.

(56) References Cited

U.S. PATENT DOCUMENTS

| | | | |
|---|---|---|---|
| 5,665,996 A * | 9/1997 | Williams et al. | 257/401 |
| 5,739,587 A * | 4/1998 | Sato | 257/758 |
| 6,291,331 B1 * | 9/2001 | Wang et al. | 438/618 |

* cited by examiner

*Primary Examiner*—Phat X. Cao
(74) *Attorney, Agent, or Firm*—Frederick J. Telecky, Jr.; W. James Brady, III

(57) ABSTRACT

A semiconductor integrated circuit comprises contact pads located over active components, which are positioned to minimize the distance for power delivery between a selected pad and one or more corresponding active components, to which the power is to be delivered. This minimum distance further enhances dissipation of thermal energy released by the active components.

More specifically, a semiconductor integrated circuit comprises a laterally organized power transistor, an array of power supply contact pads distributed over the transistor, means for providing a distributed, predominantly vertical current flow from the contact pads to the transistor, and means for connecting a power source to each of the contact pads. Positioning the power supply contact pads directly over the active power transistor further saves precious silicon real estate area. The means for vertical current flow include contact pads made of a stack of metal layers comprising refractory metals for adhesion, copper and nickel as stress-absorbing metals, and gold or palladium as bondable and solderable outermost metals. The means for connecting a power source include wire bonding and solder ball interconnection.

21 Claims, 5 Drawing Sheets

INTEGRATED POWER CIRCUITS WITH DISTRIBUTED BONDING AND CURRENT FLOW

This application claims priority from provisional application number 60/221,051, filed Jul. 27, 2000.

1. Field of the Invention

The present invention is related in general to the field of semiconductor devices and processes, and more specifically to integrated power circuits that permit wire bonding to be performed directly over portions of the active circuit area.

2. Description of the Related Art

Two independent trends in semiconductor technology, both with a long history, contribute to the urgency for the present invention. The first technology trend concerns aspects of manufacturing cost savings by conserving semiconductor "real estate".

In order to accommodate balls of bonding wires or solder, typical bonding pads on silicon integrated circuits (ICs) have to be of sufficient size; they typically range from squares of 80×80 μm to squares of 150×150 μm. They consume, therefore, an area between approximately 1 and 20%, sometimes up to 45%, of the circuit area, dependent on the number of bonding pads and the size of the integrated circuit. For manufacturing and assembly reasons, the bonding pads are arranged in rows along the periphery of the circuit, usually stringed along all four chip sides.

Until now, all semiconductor devices manufactured had to exclude the area covered by the bonding pads from use for laying out actual circuit patterns because of the high risk of damaging the circuit structures due to the unavoidable mechanical forces and metallurgical stresses needed in the bonding process. Evidently, considerable savings of silicon real estate can be obtained if circuit patterns could be placed under the bonding pad metal. One way to achieve this feature would be to create another level of metallization dedicated solely to bonding pad formation. This level would be built over a protective overcoat covering an active circuit area. In existing technology, however, a special stress buffer layer of polyimide has to be applied between the protective overcoat and the extra metal layer, as shown by K. G. Heinen et al. ("Wire Bonds over Active Circuits", Proc. IEEE 44 th Elect. Comp. Tech. Conf., 1994, pp. 922–928). The cost of applying this polyimide layer has so far prohibited the implementation of this bonds-over-active-circuit concept.

Another approach in existing technology has been proposed in U.S. Patent Application No. 60/092,961, filed Jul. 14, 1998 (Saran, "System and Method for Bonding Over Active Integrated Circuits"). In order to make the bonding pads strong enough to withstand the mechanical forces required in the wire bonding process, reinforcing systems under the bonding pad are described which utilize specific portions of the actual IC as the means to reinforce weak dielectric layers under the bonding pad. This method requires specific design or redesign of the IC and is poorly suited for standard linear and logic ICs which often have numerous bonding pads but relatively small circuit areas.

The second technology trend concerns certain processes in the assembly of a semiconductor chip. It is well known that bonding pads in silicon ICs can be damaged during wafer probing using fine-tip tungsten needles, further during conventional thermosonic wire bonding to aluminum metallization on the circuits, or during solder ball attachment in chip-to-substrate devices of more recent assembly developments. In wire bonding, particularly suspect are the mechanical loading and ultrasonic stresses applied the tip of the bonding capillary to the bonding pad. When the damage is not apparent during the bonding process, the defects may manifest themselves subsequently by succumbing to thermo-mechanical stresses generated during the plastic encapsulation, accelerated reliability testing, temperature cycling, and device operation. The damage appears in most cases as microcracks which may progress to fatal fractures in the underlying dielectric material, as chip-outs of brittle or mechanically weak dielectric films, often together with pieces of metal or silicon, or as lifted ball bonds, or as delamination of metal layers.

Recent requirements in the semiconductor technology tend to aggravate the problem. For instance, newer dielectric materials such as silicon-containing hydrogen silsesquioxane (HSQ) are being preferred due to their lower dielectric constant which helps to reduce the capacitance C in the RC time constant and thus allows higher circuit speeds. Since lower density and porosity of dielectric films reduce the dielectric constant, films with these characteristics are introduced even when they are mechanically weaker. Films made of aerogels, organic polyimides, and parylenes fall into the same category. These materials are mechanically weaker than previous standard insulators such as the plasma-enhanced chemical vapor deposited dielectrics. Since these materials are also used under the bonding pad metal, they magnify the risk of device failure by cracking.

For conventional bonding pad metallization processes, a solution to the aforementioned problems was disclosed in U.S. patent application Ser. No. 08/847,239, filed May 1, 1997 (Saran et al., "System and Method for Reinforcing a Bond Pad"). Some concepts and methods of this disclosure have been subsequently described by M. Saran et al. in a publication entitled "Elimination of Bond-pad Damage through Structural Reinforcement of Intermetal Dielectrics" (Internat. Reliab. Physics Symp., March 1998). In essence, a metal structure designed for mechanical strength serves as a reinforcement for the mechanically weak dielectric layer. For metal structures made with the damascene technique, U.S. Patent Application No. 60/085,876, filed May 18, 1998 (Saran et al., "Fine Pitch System and Method for Reinforcing Bond Pads in Semiconductor Devices") teaches the design and fabrication process reinforcing weak dielectrics under the bonding pads.

Another approach to forming bonds over active circuit portions is described in U.S. patent applications Ser. No. 08/959,410, filed on Oct. 28, 1997, and TI-31924, submitted on Jul. 7, 2000 (Shen et al., "Integrated Circuit with Bonding Layer over Active Circuitry"), to which the present invention is related. Vias to the top metallization layer of the circuit are coated with seed metal and then plated with successive metal layers, thereby filling the vias and forming attachment surfaces for wire bonds or solder balls.

Another approach to forming bonds over active circuit portions is described in U.S. patent application Ser. No. 09/458,593, filed on Dec. 12, 1999 (Zuniga et al., "System and Method for Bonding over Integrated Circuits"), to which the present invention is related. A combination of bondable and stress-absorbing metal layers, and a mechanically strong, electrically insulating layer separate a bond pad and a portion of the integrated circuit located under the bond pad.

None of these approaches of forming bonds over active circuits exploit the new technical advantages to improve the circuit functions, or propose a method to advance critical device performances. An urgent need has therefore arisen for a low-cost, reliable structure and method technology combining the manufacture of wire and solder ball bonds directly over active IC areas with significant improvements of device and circuit characteristics. The system should provide stress-free, simple, and no-cost-added contact pads for flexible, tolerant bonding processes even when the contact pads are situated above one or more structurally and mechanically weak dielectric layers. The system and method should be applicable to a wide spectrum of design, material and process variations, leading to significant savings of silicon, as well as to improved device characteristics and reliability and process yield. Preferably, these innovations should be accomplished using the installed process and equipment base so that no investment in new manufacturing machines is needed.

SUMMARY OF THE INVENTION

A semiconductor integrated circuit comprises contact pads located over active components, which are positioned to minimize the distance for power delivery between a selected pad and one or more corresponding active components, to which the power is to be delivered. This minimum distance further enhances dissipation of thermal energy released by the active components.

More specifically, a semiconductor integrated circuit comprises a laterally organized power transistor, an array of power supply contact pads distributed over the transistor, means for providing a distributed, predominantly vertical current flow from the contact pads to the transistor, and means for connecting a power source to each of the contact pads. Positioning the power supply contact pads directly over the active power transistor further saves precious silicon real estate area. The means for connecting a power source include wire bonding and solder ball interconnection.

As preferred embodiments of this invention, the power transistors are laid out as cells in an arrayed arrangement. Examples are geometries shaped as long stripes designed in lateral layout. For vertical styles, there can be vertical and lateral trench devices including silicon-on-insulator technologies.

For voltages below 10 V, lateral transistors based on CMOS technology are good examples. For voltages above 10 V, devices with extended drains are favored. For voltages greater than about 20 V, devices based on LDMOS technology are preferred examples.

In a preferred embodiment of the invention, the active circuit of a semiconductor device is fabricated on a silicon substrate and comprised of an integrated power transistor; the circuit has at least one metallization layer forming a plurality of first and second electrodes of the transistor. A first bus is connecting all of first electrodes, and a second bus is connecting all of second electrodes; each bus is connected to the respective electrode by metal-filled vias. Consequently, the buses are positioned directly over the transistor. A mechanically strong, electrically insulating film is overlaying the circuit, the transistor, and the buses. A plurality of contact pads is distributed over each of the buses; each pad has a stack of stress-absorbing metal layers, and the outermost layer is metallurgically attachable. Further, each pad is connected to the underlying bus through openings in the insulating film, and the openings are positioned substantially vertically over at least one of the vias. At least one connecting member, such as bonding wire or solder ball, is attached to the contact pads. Consequently, the electrical current path and resistance from the connecting member to the electrodes are minimized, which enables an improvement of the electrical characteristics of the power transistor.

It is an object of the present invention to reduce the cost of IC chips by reducing the silicon area consumed for the overall circuit design. This object is achieved through utilizing the areas underneath the (numerous) contact pads by positioning the power transistor of the actual circuit under the contact pad areas.

Another object of the present invention is to advance the process and operation reliability of semiconductor probing, and wire bonded and solder-attached assemblies by providing the pad metal layers, and insulating layers separating the contact pad and the circuit, in thicknesses sufficient to reliably absorb mechanical, thermal and impact stresses.

Another object of the invention is to eliminate restrictions on the processes of probing and of wire bonding and solder attachment, thus minimizing the risks of inflicting cracking damage even to very brittle circuit dielectrics.

Another object of the invention is to provide design and layout concepts and process methods which are flexible so that they can be applied to many families of semiconductor IC products, and are general, so that they can be applied to several generations of products.

Another object of the invention is to provide a low-cost and high-speed process for fabrication, testing and assembly.

Another object of the invention is to use only design and processes most commonly used and accepted in the fabrication of IC devices, thus avoiding the cost of new capital investment and using the installed fabrication equipment base.

These objects have been achieved by the teachings of the invention concerning design concepts and process flow suitable for mass production. Various modifications have been successfully employed so satisfy different selections of product geometries and materials.

The technical advances represented by the invention, as well as the objects thereof, will become apparent from the following description of the preferred embodiments of the invention, when considered in conjunction with the accompanying drawings and the novel features set forth in the appended claims.

DETAILED DESCRIPTION OF THE PREFERRED EMBODIMENTS

The present invention is related to U.S. patent application Ser. No. 08/959,410, filed on 28 Oct. 1997 (Shen et al., "Integrated Circuit with Bonding Layer over Active Circuitry", TI-24445); TI-31294, submitted on 7 Jul. 2000 (Shen et al., "Integrated Circuit with Bonding Layer over Active Circuitry"); and Ser. No. 09/458,593, filed on 10 Dec. 1999 (Zuniga et al., "System and Method for Bonding over Integrated Circuits", TI-27502).

Figure 1:
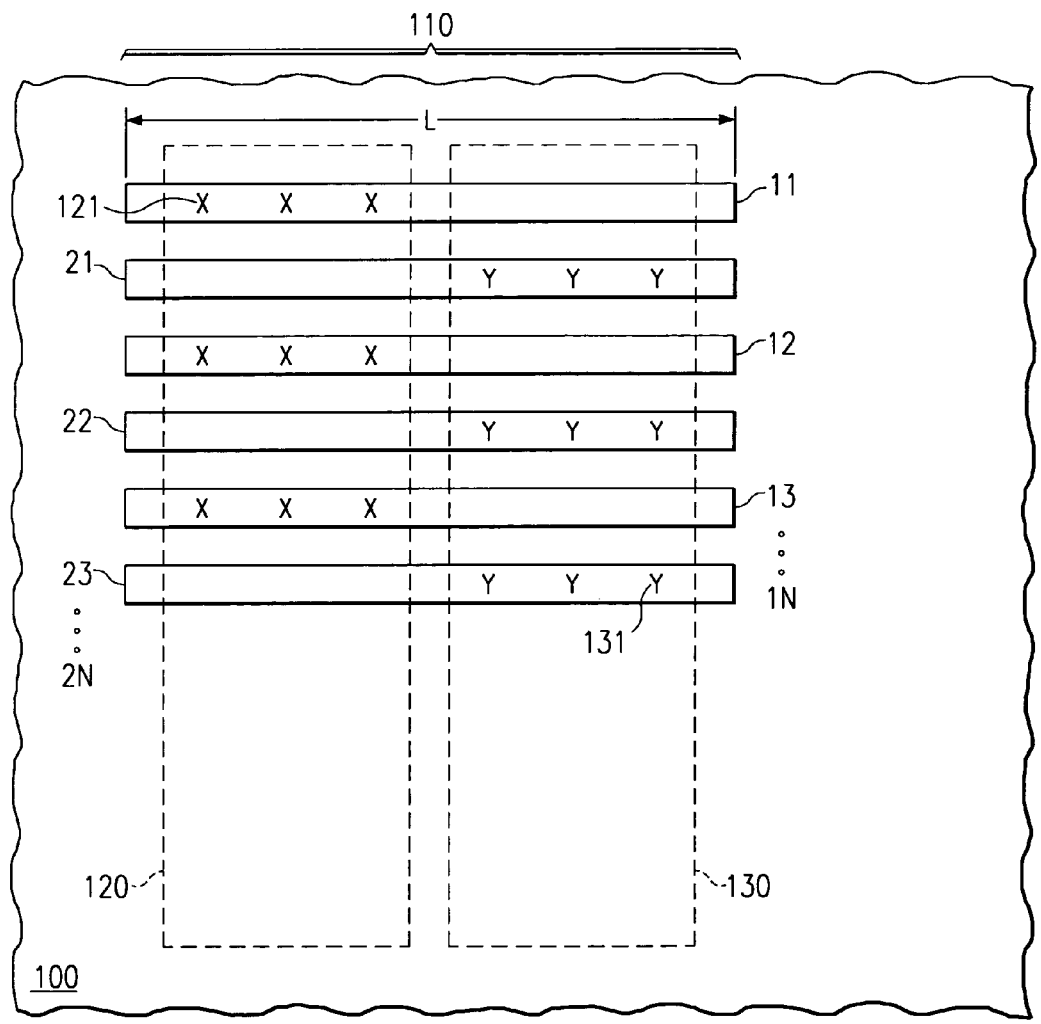
FIG. 1 is a simplified and schematic top view of a portion of an integrated circuit (IC) chip with a power transistor laid out laterally, having a plurality of stripes for source and drain, and two bus metallizations.

FIG. 1 illustrates a portion of a semiconductor integrated circuit (IC) chip 100 having a power transistor generally designated 110. This power transistor features a plurality of alternating regions for source and drain, which, by way of example, are arranged laterally in elongated strips and parallel to each other at a certain pitch. Each region is contacted by electrodes formed from a layer of metal, shown in FIG. 1 as parallel lines of length L and designated 11, 12, 13, . . . , 1N for the source electrodes, and 21, 22, 23, . . . , 2N for the drain electrodes. The arrays of source and drain can be designed in different geometries in order to reduce the lateral electrical resistance of the sheet-like metal.

Perpendicular to the orientation of the source and drain lines, and separated from them by an electrically insulating layer, are two bus metallizations 120 and 130. Typically, the bus is made from sheet-like metal deposited as a layer. Bus 120 is electrically connected to each source line by a plurality of metal-filled vias, symbolized by "x" signs 121 in FIG. 1. Bus 130 is electrically connected to each drain line by a plurality of metal-filled vias, symbolized by "y" signs 131 in FIG. 1.

Figure 2A:
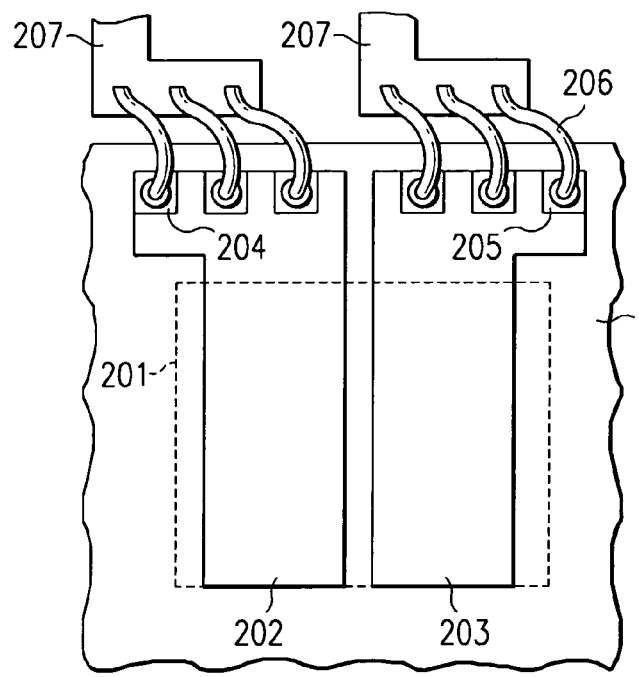
FIG. 2A is a schematic and simplified top view of a portion of an IC chip showing the bus metallizations of a lateral power transistor including a plurality of contact pads and connecting members aligned along the periphery of the IC chip.

Each bus needs to be connected to the outside power source by a plurality of contact pads. As defined herein, the contact pads of an IC refer to the input/output (I/O) terminals of the IC, specifically to the metallized I/Os of the circuit. When wire bonding is used in the assembly of the IC chips, these pads are referred to as "bonding pads" or "bond pads". In conventional arrangement, these contact pads are aligned close to the chip periphery, more or less in a linear array, in order to keep the length of connecting members to the "outside world" short. In FIG. 2A, the simplified top view of a portion of an IC chip 200 is shown, with the area of the active, laterally organized power transistor surrounded by the dashed line 201. Sheet-like metal is formed as wide-area bus 202 for connecting all source electrodes, and as bus 203 for connecting all drain electrodes.

Significant portions of buses 202 and 203 are located outside of the transistor area surrounded by line 202; these portions are used for accommodating the plurality of contact pads 204 and 205, respectively. These pads are arranged in substantially linear arrays along the periphery of chip 200, consuming large areas of "silicon real estate" (chips 200 are fabricated on substrates overwhelmingly made of silicon semiconductor material). In modern circuits, numerous contact pads are needed, often several hundred for ground and power connections alone. Together with signal connections, some ICs require more than 1000 contact pads, causing a significant sacrifice of precious silicon "real estate".

In FIG. 2A, the connecting members to the "outside world" are bonding wires; wires 206 connect pads 204 and 205 to outside leadframes 207. Typical wire materials include pure or alloyed gold, copper and aluminum. For gold, commonly used wire diameters range from about 20 to 50 µm. In wire ball bonding, the ball is usually attached to the chip; consequently, the pad areas have to be large enough to place the ball securely, when it is flattened to the typical "nailhead" shape by the bonding capillary in the bonding operation. Free air ball typically have diameters from about 1.2 to 1.6 wire diameters, so that pads 204 and 205 have to range from about 50×50 µm to 150×150 µm squared, dependent on the processing parameters.

If the connecting members are solder balls, typical ball diameters range from about 0.2 to 0.5 mm, and the areas of contact pads 204 and 205 have to be in the range from about 0.3 to 0.7 mm squared. (As defined herein, the term solder ball does not imply that the solder contacts are necessarily spherical. They may have various forms, such as semispherical, half-dome, truncated cone, or generally bump. The exact shape is a function of the deposition technique and reflow technique, and the material composition).

Figure 2B:
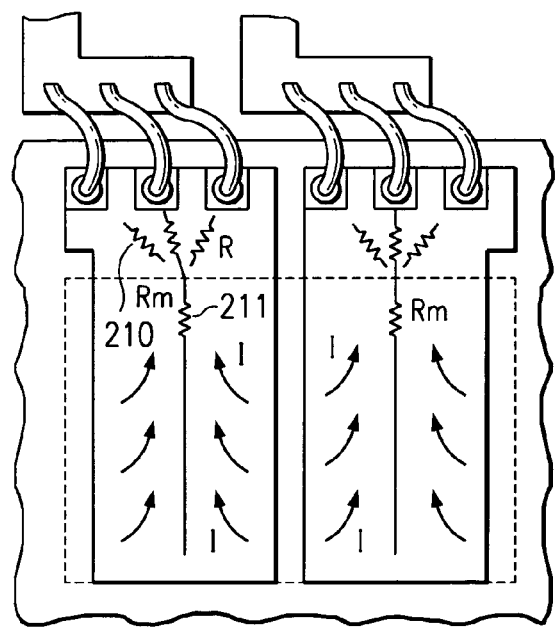
FIG. 2B is a schematic and simplified top view of an IC chip analogous to FIG. 2A, schematically indicating electrical resistances in current flow.

FIG. 2B indicates schematically the electrical consequences for the operation of the power transistor caused by the remote location of the connecting members to the power supply. As in FIG. 2A, FIG. 2B shows the same bus arrangement over the distributed source and drain regions of a power transistor, again with the contact pads arrayed along the chip periphery. In the figure and the inset electric diagram, three resistors 210 are shown, called Rb; they are in parallel. Further, the distributed lateral linear resistors 211, called Rm, are in series and represent a significant resistance for the current I flowing through the buses, causing significant voltage drops and current de-biasing. Rs is the resistance in the transistor itself; it has to be added in series. Estimating series and parallel arrangements of the resistors as indicated by the insert of FIG. 2B for a typical transistor layout, reveals a de-biasing effect of 10 to 30% of the power transistor efficiency. It is a key feature of the present invention to eliminate, or at least to minimize, this loss.

Experience of many years has shown that the process of wire bonding exerts considerable stress onto the underlying layers of metal and insulators. Main contributors to the challenge of this process step are the impact of the bonding capillary (to flatten the gold ball and form the nailhead contact), the frequency and energy of the ultrasonic agitation of the capillary and the gold ball (to break through the aluminum oxide film on the surface of the exposed metal layer 103), and the time and temperature of the process (to initiate the formation of the intermetallic compounds of the gold/aluminum weld). Due to the stress of the wirebonding operation, and also the stresses exerted in multiprobe testing and in device operation after assembly, design rules for the layout of the IC have been established over the years which prohibit circuit structures to be placed in the area under the bonding pad, and also recommend to avoid the use of brittle, mechanically weak dielectric materials. Otherwise, the risk of cracking or cratering the layers under the bonding pad has been found to be acceptably high. Consequently, considerable real estate area of silicon is required just for accommodating the bonding pad.

Figure 3A:
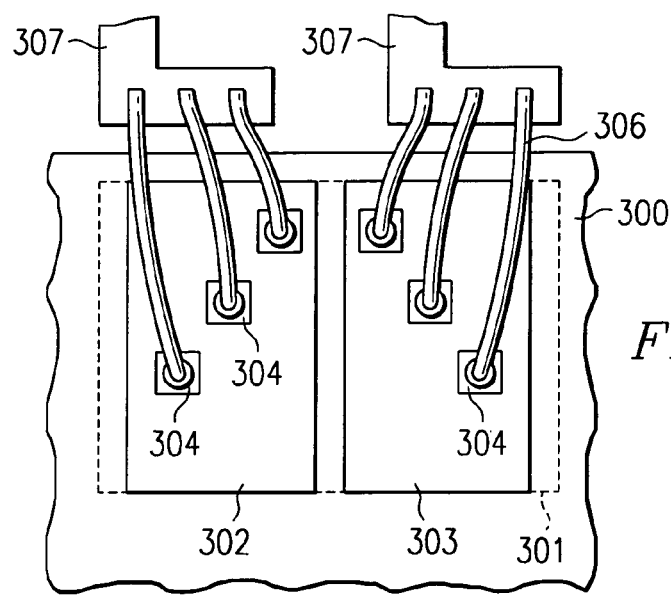
FIG. 3A is a schematic and simplified top view of a portion of an IC chip showing the bus metallizations of a lateral power transistor including a plurality of contact pads arranged over the active transistor according to an embodiment of the invention.

The implementation of the process solutions according to this invention, described below, lead to solutions of "bonds over active circuitry" as depicted in the example of FIG. 3A. By active circuitry is meant the various electrical components that provide functionality to the IC. For this invention, active circuitry specifically refers to the power bus metal layer of laterally organized power transistors. In FIG. 3A, the simplified top view of a portion of an IC chip 300 is shown, with the area of the active power transistor surrounded by the dashed line 301. Sheet-like metal is formed as wide-area bus 302 for connecting all source electrodes, and as bus 303 for connecting all drain electrodes. The plurality of contact pads 304 is positioned over the buses (structure of the contact pads and method of fabrication are described below). With this arrangement, significant silicon real estate can be saved compared to the arrangement in FIG. 2A. Dependent on the number and size of contact pads, between about 10 and >40% of the chip area can be saved.

In FIG. 3A, the connecting members to the "outside world" are bonding wires 306, connecting pads 304 to outside leadframes 307 and thus to the power supply. It is important for the present invention that recent technical advances in wire bonding allow the formation of reliable ball contacts, long wires and tightly controlled shape of the wire loop. Such advances can, for instance, be found in the computerized bonder 8020 by Kulicke & Soffa, Willow Grove, Pa., U.S.A., or in the ABACUS SA by Texas Instruments, Dallas, Tex., USA Moving the capillary in a predetermined and computer-controlled manner through the air will create a wire looping of exactly defined shape. For instance, with the recent technical advances, rounded, trapezoidal, linear and customized loop paths can be formed.

Figure 3B:
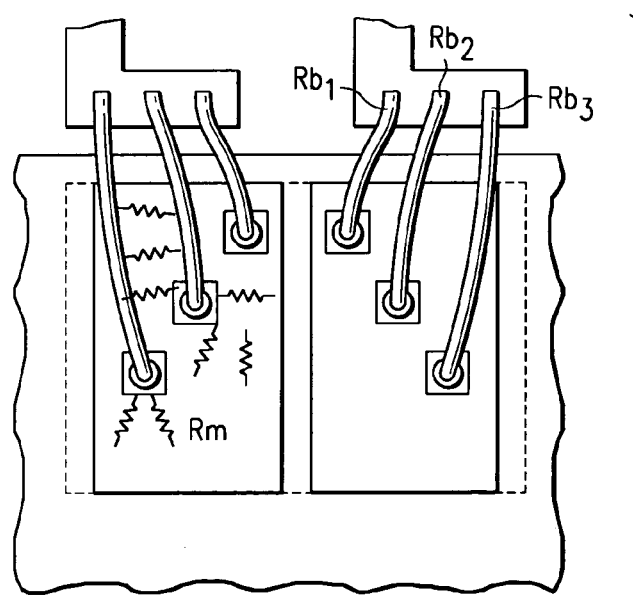
FIG. 3B is a schematic and simplified top view of an IC chip analogous to FIG. 3A, schematically indicating electrical resistances in current flow.

FIG. 3B depicts schematically the electrical advantages for the operation of the power transistor caused by the over-the-transistor location of the connecting members to the power supply. As the starburst-like resistor elements indicate, which are schematically shown in FIG. 3B, the positioning of the bonding pads provides a regime of sheet resistance rather than the lateral linear resistor of FIG. 2B, thus enabling a reduction of about 30 to >60% of the resistance. Consequently, the voltage drop correlated with this resistance and thus the corresponding de-biasing effect are reduced, and the transistor performance improved. In the inset electric diagram, the spreading resistances Rm are now in series with the various wire resistances Rb, yet the resulting resistances are in parallel to each other, thus reducing the overall resistance. In FIG. 3B, only Rs, the resistance in the transistor itself, remains unchanged compare to the inset diagram in FIG. 2B.

Important as this reduction in resistance is for the improvement of the transistor current flow, even more significant is the opportunity which the design of bonds-over-active-transistor offers for converting relatively long-distance lateral current flow into short-distance vertical current flow. This innovation can be best understood in combination with FIGS. 4 and 5.

Figure 4:
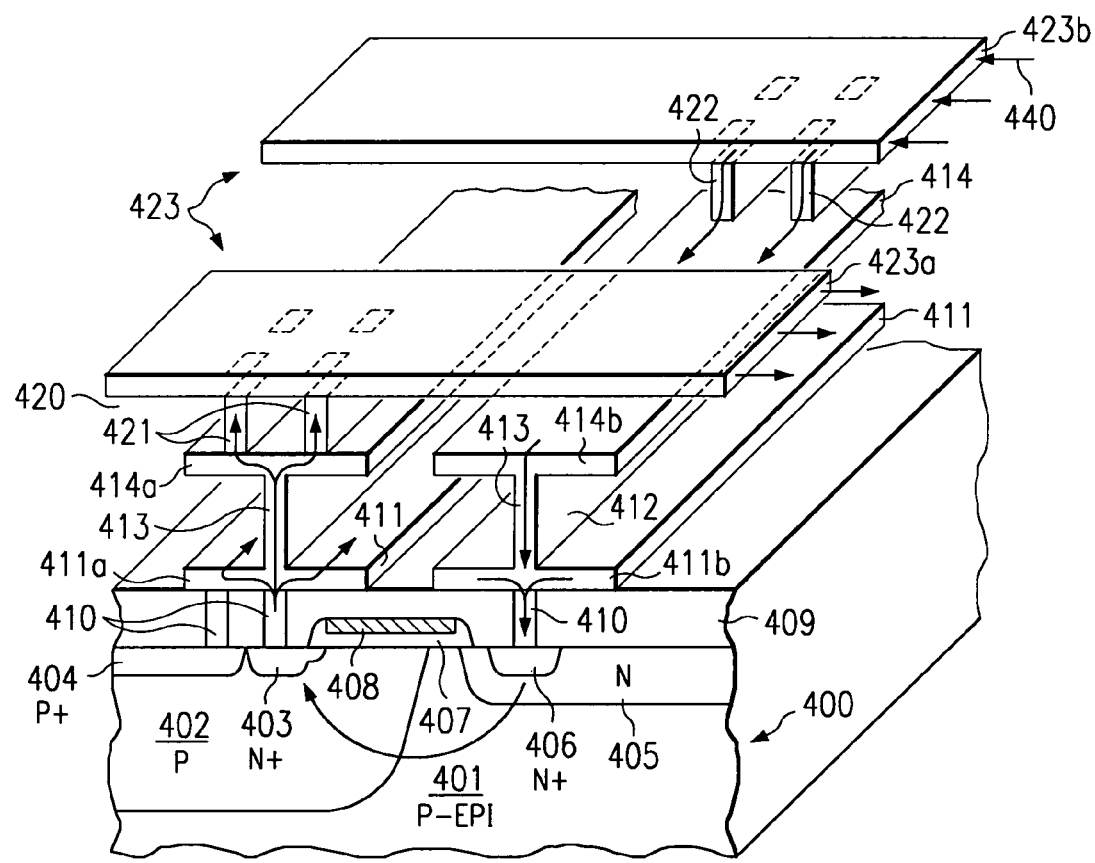
FIG. 4 is a simplified perspective and cross sectional view of the vertical and lateral configuration of a portion of an integrated power transistor. Some electrical current flow patterns and resistances are schematically indicated.

FIG. 4 combines a simplified cross section of an integrated lateral power transistor with a perspective view of the power supply to this transistor. Lateral DMOS transistor 400 is fabricated in p-epitaxial layer 401. Lateral DMOS transistor 400 includes a DWELL region 402, n+ source region 403, p+ back gate region 404, RESURF region 405, n+ drain region 406, gate oxide 407, and polysilicon gate 408. Lateral DMOS transistor 400 could be manufactured using the lateral DMOS process described in U.S. Pat. No. 5,272,098, which is hereby incorporated by reference. Alternatively, lateral DMOS transistor 400 could be manufactured according to the methods described in U.S. Pat. Nos. 5,242,841 or 5,306,652, which are hereby incorporated by reference.

Subsequently to the steps necessary to fabricate elements of lateral DMOS transistor 400 described above, an inter-level insulator layer 409 is deposited. Insulator layer 409 is then patterned and etched to form vias 410, using standard photolithographic techniques. Metallization layer 411 is deposited over insulator layer 409 and into vias 410 and patterned and etched. Metal layer 411 is sometimes referred to as "metal 1". The patterned portion 411a, which is in contact with source region 403, serves as source electrode of the transistor, and the patterned portion 411b, which is in contact with drain region 406, serves as drain electrode. A second interlevel insulator layer 412 (indicated in FIG. 4 as an open space) is then deposited over metallization layer 411 and patterned and etched to form vias 413 therein. Next, metallization layer 414 is deposited over insulator layer 412 and into vias 413 and patterned and etched. Metal layer 414 is sometimes referred to as "metal 2". The patterned portion 414a, which is in contact with layer portion 411a, serves as an extension of the source electrode of the transistor. The patterned portion 414b, which is in contact with layer portion 411b, serves as an extension of the drain electrode of the transistor.

Insulator layers 409 and 412 may be formed from a nitride, oxide, nitride/oxide combination, SOG, BPSG, or low-k gel, for example. Typically metallization layers 411 and 414 are aluminum, although other metals such as copper or metal alloys could also be used. Although two metallization layers 411 and 414 are shown in FIG. 4, it is understood that a single metallization layer or more than two metallization layers could be used.

Next, a protective overcoat layer 420 (indicated in FIG. 4 as an open space) is deposited on the surface of the semiconductor wafer, uniformly covering the metallization layers 414. Overcoat layer 420 may be made from standard electrically non-conductive material, or it may be moisture impenetrable and able to protect metallization layer 414 during subsequent fabrication. Examples of suitable materials are silicon nitride, silicon oxynitride, silicon carbon alloys, oxide/nitride combinations, polyimide, and sandwiched films thereof. The thickness may range from about 400 to 1500 μm.

Using standard photolithographic techniques, vias 421 and 422 are formed through the overcoat layer 420 to metallization layer 414. The plurality of vias 421 is intended to open to the source metallization of the transistor, while the plurality of vias 422 is intended to open to the drain metallization of the transistor.

Metallization layer 423 is deposited over insulator layer 420 and into vias 241 and 422 and patterned and etched. Metal layer 423 is sometimes referred to as "metal 3". The patterned portion 423a, which is in contact with vias 421 and layer portions 414a and 411a, serves as bus for the source electrodes of the transistor. The patterned portion 423b, which is in contact with vias 422 and layer portions 414b and 411b, serves as bus for the drain electrodes of the transistor.

Figure 5:
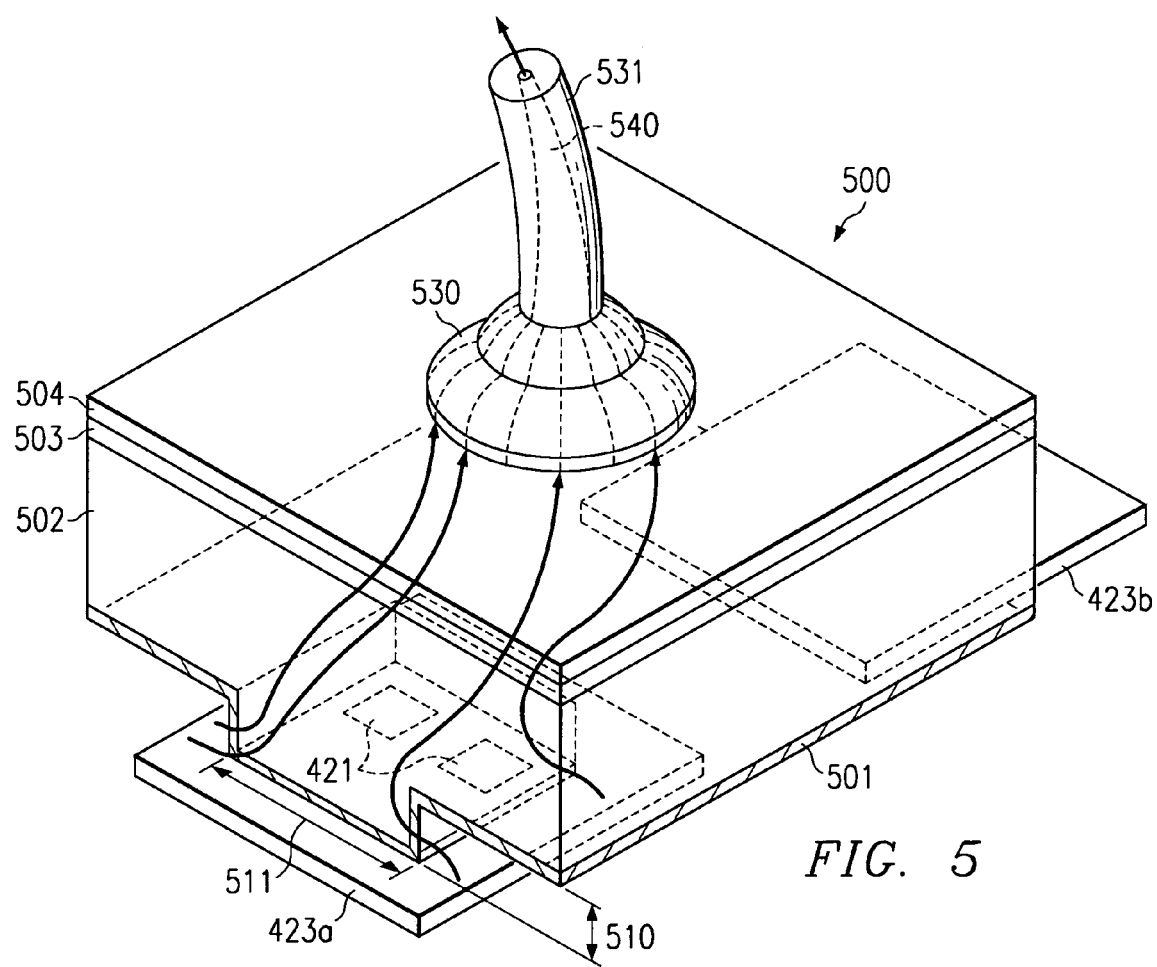
FIG. 5 is a simplified perspective and cross sectional view of the contact pad of a power transistor bus, with connecting member attached, according to an embodiment of the invention.

FIG. 5 is a continuation upwards from layers 423a and 423b shown in FIG. 5, illustrating the continued fabrication process flow. FIG. 5 combines a simplified cross section of the top portion of a power transistor with a perspective view of a contact pad generally designated 500. Contact pad 500 could be manufactured using the process described in above quoted U.S. Patent Application for TI-31294, which is hereby incorporated by reference. In FIG. 5, contact pad 500 is serving specifically the source bus 423a; analogous consideration holds for the contact pads serving the drain bus 423b.

A mechanically strong, electrically insulating film 510 (indicated in FIG. 5 as an open space) is deposited over the complete wafer surface including the bus metallizations. Similar to overcoat layer 420, the material is selected from a group consisting of silicon nitride, silicon oxynitride, silicon carbon alloys, polyimide, and sandwiched films thereof. The thickness ranges from about 400 to 1500 nm.

An opening 511 is opened in insulating film 510. It is pivotally important for the present invention that opening 511 is positioned vertically over at least one of the vias 421 or 422. In the example of FIG. 5, the opening is positioned vertically over at least one via 421 connecting the source bus to one of the source metallizations. In an analogous case, the opening may be positioned vertically over at least one of the vias 422 connecting the drain bus to one of the drain metallizations. The opening 511 is filled with metal of the layers forming stack 500.

Contact pad 500 consists of a seed metal layer 501, a first stress-absorbing metal layer 502, a second stress absorbing layer 503 and an outermost bondable metal layer 504. Seed metal layer 501 is selected from a group consisting of tungsten, titanium, titanium nitride, molybdenum, chromium, and alloys thereof. The seed metal layer is electrically conductive, provides adhesion to both the bus metal and the protective overcoat, permits the exposed portions of its upper surface to be electroplated, and prevents migration of the subsequent stress-absorbing metals to the bus metallization layers. The thickness of seed metal layer 501 is between about 100 and 500 nm. Alternatively, the seed metal layer 501 may be composed of two metal layers; an example for the second metal is copper, since it provides a suitable surface for subsequent electroplating.

It should be pointed out for the present invention that a single seed layer can preferably be made of refractory metal which has a thickness large enough to reliably act as a stress-absorbing buffer. Thicknesses between about 200 and 500 nm, preferably about 300 nm, are satisfactory. The thickness for optimum stress absorption depends not only on the selected metal, but also on the deposition technique selected, the rate of deposition, and the temperature of the silicon substrate during the time of deposition, since these parameters determine the microcrystallinity of the deposited layer. It has been found, for instance, that when using sputter deposition of tungsten, the layer formation is preferably performed at a rate of about 4 to 5 nm/s onto a silicon substrate at ambient temperature, increasing to about 70° C. when a thickness of at least 300 nm is reached. The tungsten microcrystals thus created have an average size and distribution such that they act reliably as stress-absorbing "springs" during the wire bonding process in assembly.

For depositing the (thicker) stress-absorbing layers 502 and 503, it is advantageous to employ an electroplating process. An example for the first stress-absorbing metal layer 502 is copper. Its thickness in the range from about 2 to 35 µm makes it a mechanically strong support layer for subsequent attachment of connecting members such as bonding wires. An example for the second stress-absorbing metal layer 503 is nickel in the thickness range from about 1 to 5 µm.

The outermost layer 504 is metallurgically bondable or solderable. If wire bonding is the connecting method selected and layer 504 should be bondable, favorable metal choices include pure or alloyed aluminum, gold palladium, and silver. If soldering is the connecting method selected and layer 504 should be solderable, favorable metal choices include palladium, gold, silver and platinum. In both cases, the thickness is in the 500 to 2800 nm range. It is understood that the number of layers, the choice of materials and their thicknesses, and the deposition processes can be varied in order to suit specific device needs.

Figure 2B:
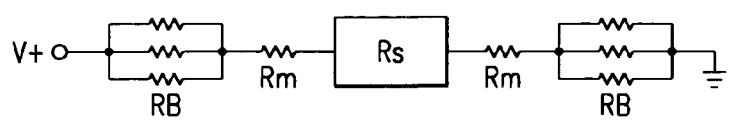
Figure 3B:
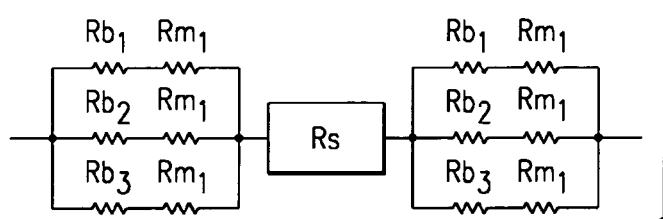

The plating pattern of the contact pads may form any desired pattern. As can be seen in the example of FIG. 5, the connector stack 500 has its opening to the source bus located vertically over the vias to the source metallization, yet it extends geometrically beyond the direct area of the opening. In this example, the contact pad 500 extend over the adjacent drain bus 423b, from which it is isolated by dielectric layer 510. This arrangement provides for sufficient surface area of the pad to attach the ball 530 (even relatively large ones) of a bonding wire 531. Contact pad 500 is equally well suited for attaching a wedge bond or a stitch bond. In all cases, the other end of wire 531 may be bonded to a leadframe (see FIGS. 2 and 3) or substrate carrying a conductive pattern on which the IC chip is mounted.

As pointed out above, outermost layer 504 may be selected so that it is solderable. A solder ball can then be attached to it by standard reflow techniques. However, it was described in the above-cited U.S. Patent Application TI-31294 that it is often advisable to employ an additional solder mask or polyimide layer (not shown in FIG. 5) with an opening for each solder ball in order to keep the flip-chip bump in a defined area and shape during bump formation and subsequent attachment to an external package or board.

FIG. 4 in combination with FIG. 5 highlights the pivotal feature of the present invention how the placement of bonds over the active power transistor enables short-distance vertical current flow and minimizes long-distance lateral current flow. In other words, electrical resistance in current flow is minimized. In FIG. 4, electrical current 440 from the drain bond flows, in conventional directional nomenclature, through drain bus 423b to the vias 422. Flowing vertically through vias 422 into drain electrodes 414b, and vertically through vias 413 and 410, the current flows into the drain of the power transistor. After exiting the power transistor as source current, it flows again vertically through vias 410 and 413 to the source electrode 414a. Continuing vertically through vias 421 into the source bus 423a, the current enters through opening 511 into the contact pad 500 and continues vertically into bond wire 531. The current 540 flows to the source bond.

It should be mentioned that the positioning of the contact pads can be exploited to improve the dissipation of thermal energy released by the active components of the IC. This is especially true when solder bumps are employed as connecting means to the "outside world", minimizing the thermal path and thermal resistance for heat dissipation.

OTHER EMBODIMENTS

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description.

As an example, the invention covers generally a semiconductor integrated circuit which comprises contact pads located over active components, and the position of these pads are selected so that they provide control and distribution of power to the active components below the pads.

As another example, the invention covers a semiconductor IC which comprises contact pads located over active components, and these pads are positioned to minimize the distance for power delivery between a selected pad and one or more corresponding active components, to which the power is to be delivered.

It is therefore intended that the appended claims encompass any such modifications or embodiments.

We claim:

1. A semiconductor device comprising:
   a semiconductor substrate;
   an active circuit fabricated on said substrate and comprised of an integrated power transistor, said circuit having at least one metallization layer forming a plurality of first and second electrodes of said transistor;
   a first bus connecting all of said first electrodes, and a second bus connecting all of said second electrodes, each bus connected to said respective electrode by metal-filled vias, whereby said buses are positioned directly over said transistor;
   a mechanically strong, electrically insulating film overlaying said circuit, said transistor, and said buses;
   a plurality of contact pads distributed over each of said buses, each of said pads having a stack of stress-absorbing metal layers, the outermost layer being metallurgically attachable, and a connection to the underlying bus through openings in said insulating film, said openings positioned substantially vertically over at least one of said vias; and
   at least one connecting member attached to said contact pads, whereby the electrical current path and resistance from said member to said electrodes are minimized, improving the electrical characteristics of said power transistor.

2. The device according to claim 1 wherein said substrate is selected from a group consisting of silicon, silicon germanium, gallium arsenide, and any other semiconductor material customarily used in electronic device production.

3. The device according to claim 1 wherein said circuit comprises a plurality of active and passive electronic components arranged horizontally and vertically.

4. The device according to claim 1 wherein said power transistor is laid out horizontally, having said electrodes arranged in a plurality of metal bands substantially parallel to each other.

5. The device according to claim 4 wherein said power transistor comprises electrical current flowing horizontally through said electrodes and said semiconductor between said electrodes.

6. The device according to claim 1 wherein said at least one metallization layer is made of pure or alloyed copper, aluminum, nickel, or refractory metals.

7. The device according to claim 1 wherein said electrically insulating film further serves as the protective overcoat of said integrated circuit.

8. The device according to claim 1 wherein said electrically insulating film comprises materials selected from a group consisting of silicon nitride, silicon oxynitride, silicon carbon alloys, polyimide and sandwiched films thereof.

9. The device according to claim 8 wherein said electrically insulating film is between about 400 and 1500 nm thick.

10. The device according to claim 1 wherein said stack of metal layers of said contact pads comprise a layer of seed metal on said bus bar, promoting adhesion to said bus bars and inhibiting migration of overlying metals to said bus bar, at least one stress-absorbing metal layer, and an outermost metallurgically attachable metal layer.

11. The device according to claim 10 wherein said seed metal layer is selected from a group consisting of tungsten, titanium, titanium nitride, molybdenum, chromium, and alloys thereof.

12. The device according to claim 11 wherein said layer of seed metal is between about 200 and 500 nm thick.

13. The device according to claim 10 wherein said stress-absorbing metal layer comprises at least one layer selected from a group consisting of copper, nickel, aluminum, and alloys thereof.

14. The device according to claim 13 wherein said stress-absorbing metal layer is between about 2 and 35 μm thick.

15. The device according to claim 10 wherein said outermost metal layer is metallurgically bondable or solderable.

16. The device according to claim 15 wherein said outermost bondable metal layer is selected from a group consisting of pure or alloyed aluminum, gold, palladium, and silver.

17. The device according to claim 15 wherein said solderable metal layer is selected from a group consisting of palladium, gold, silver and platinum.

18. The device according to claim 15 wherein said outermost layer is between about 500 and 2800 nm thick.

19. The device according to claim 1 wherein said connecting member is a bonding wire or a solder ball.

20. The device according to claim 19 wherein said bonding wire is selected from a group consisting of pure or alloyed gold, copper, and aluminum.

21. The device according to claim 19 wherein said solder ball is selected from a group consisting of tin, tin alloys including tin/copper, tin/indium, tin/silver, tin/bismuth, tin/lead, and conductive adhesive compounds.

* * * * *